United States Patent
Chen et al.

(10) Patent No.: US 7,679,722 B2
(45) Date of Patent: Mar. 16, 2010

(54) RETICLE MANAGEMENT SYSTEMS AND METHODS

(75) Inventors: Yung-Ho Chen, Hsinchu (TW); Ping-Yung Yen, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 735 days.

(21) Appl. No.: 11/554,060

(22) Filed: Oct. 30, 2006

(65) Prior Publication Data

US 2008/0100814 A1    May 1, 2008

(51) Int. Cl.
G03B 27/62 (2006.01)
G06F 7/00 (2006.01)
G06F 19/00 (2006.01)

(52) U.S. Cl. .................. 355/75; 414/938; 700/121; 707/5

(58) Field of Classification Search .......... 355/53, 355/75, 77; 414/217.1, 935, 938; 700/96, 700/100, 101, 121; 707/5, 10, 102
See application file for complete search history.

(56) References Cited

U.S. PATENT DOCUMENTS

| 6,123,120 | A  * | 9/2000  | Yotsumoto et al. ............ 141/65 |
| 6,431,814 | B1 * | 8/2002  | Christensen et al. .......... 702/81 |
| 6,598,789 | B1 * | 7/2003  | Matsumoto et al. ......... 235/383 |
| 6,848,876 | B2 * | 2/2005  | Babbs et al. ............. 414/217.1 |
| 7,058,627 | B2 * | 6/2006  | Wiesler et al. ................. 707/5 |
| 7,146,237 | B2 * | 12/2006 | Lev-Ami et al. ............ 700/121 |
| 2004/0185682 | A1 * | 9/2004 | Foulke et al. ............... 438/800 |
| 2005/0228530 | A1 * | 10/2005 | Chang et al. ................ 700/121 |

* cited by examiner

*Primary Examiner*—Alan A Mathews
(74) *Attorney, Agent, or Firm*—Thomas, Kayden, Horstemeyer & Risley (57) ABSTRACT

Reticle management systems and methods. The system comprises at least one reticle and at least one cabinet with an inert gas environment. The cabinet comprises a plurality of storage spaces. When the reticle is put in a storage space, the cabinet identifies the reticle and the storage space occupied thereby. The cabinet provides inert gas to the reticle. The storage information of the reticle in the cabinet and/or an inert gas status of the reticle are provided to a query system and a dispatch system for reticle location query and lot dispatching.

24 Claims, 7 Drawing Sheets

RETICLE MANAGEMENT SYSTEMS AND METHODS

BACKGROUND OF THE INVENTION

1. Field of the Invention

The invention relates generally to reticle management and operation for advanced technology IC foundry It is more particularly to provide not only a hardware (3 in 1 N2 e-Cabinet), but also management systems and methods to preserve MASK at a specific environment (For example: N2 gas), and charge the gas into the carrier more conveniently and efficiently, and also equip with real time information for reticle dispatching.

2. Description of the Related Art

Photolithography is an important technology in semiconductor manufacturing. The number of reticles (masks) used in photolithography corresponds to the complexity of a manufacturing process. Photolithography affects structures of semiconductor devices, such as patterns of layers and doped regions, and determines the functional effectiveness thereof. Since photolithography is complicated, photolithography apparatus, such as scanners, performing the photolithography can create a bottleneck in the manufacturing process.

Figure 1:
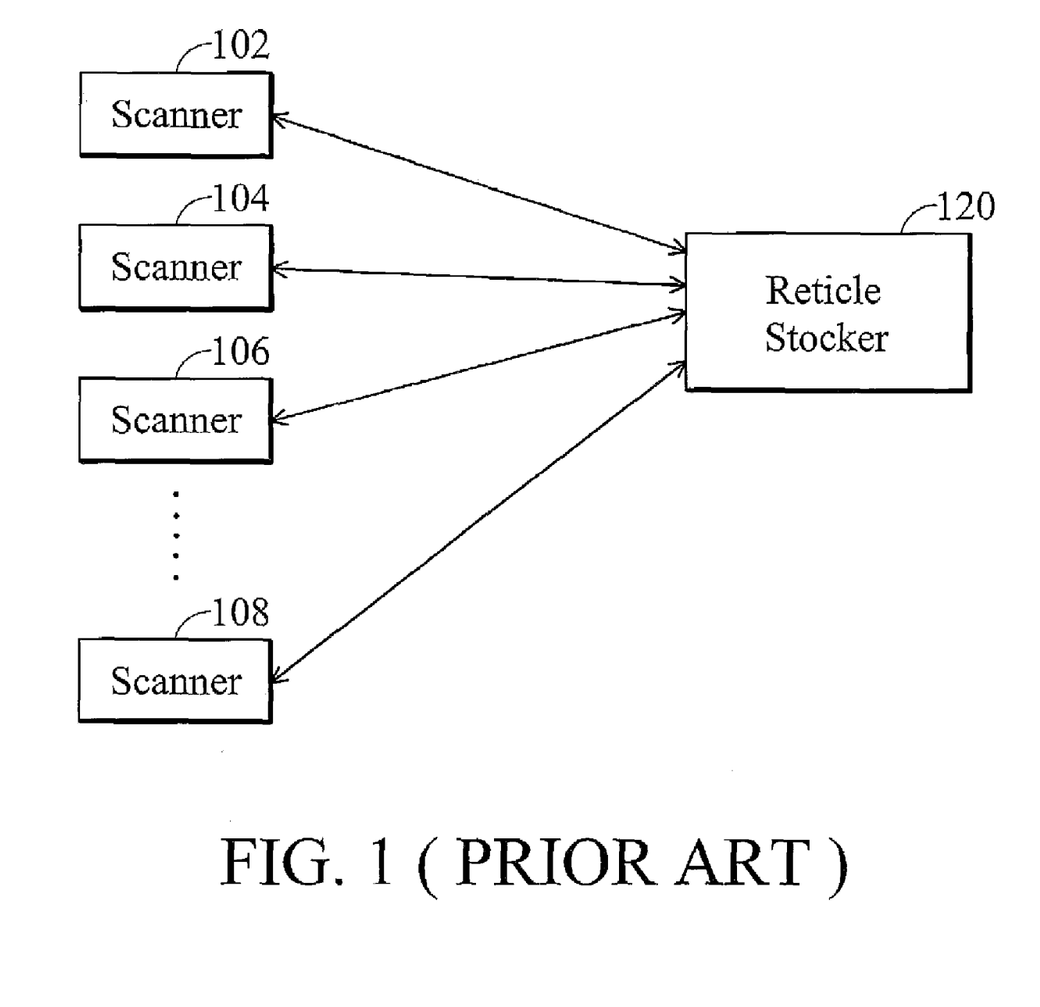
FIG. 1 is a schematic diagram illustrating conventional reticle management.

Each photolithography apparatus may have a rack for reticle storage. Due to quality concern, most of PSM reticles required storage in an inert gas such as nitrogen environment, to avoid precipitation thereon, which will impact wafer quality and increase reticle repairing opportunities that kill production cycle time and tool efficiency. FIG. 1 illustrates conventional reticle management. As shown in FIG. 1, scanners (102, 104, 106 and 108) generally use a reticle stocker 120. The reticle stocker 120 is required to store the MASK in wafer fabrication clean room for manufacturing. The reticle stocker 120 is a self-contained, clean environment electronic closet in which reticles can be stored and from which reticles can be retrieved. Additionally, the reticle stocker 120 provides an inert gas environment in which reticles of critical layers are prior to use for processing.

Generally, the reticle stocker is at a specific location which operators must move to get reticles for operation, a time-consuming and inconvenient system. The cost for reticle stocker is expensive, making it impractical to provide multiple reticle stockers in a factory. Additionally, since the reticle stocker has limited space for racks charging inert gas simultaneously, most racks must wait, thereby increasing lost time of scanners, and decreasing equipment availability and throughput of the manufacturing processes.

BRIEF SUMMARY OF THE INVENTION

Reticle management systems and methods are provided.

An embodiment of a reticle management system comprises at least one reticle and at least one cabinet with an inert gas environment, and a computer system to present the information in the cabinet to MES (Manufacturing Executive System). The cabinet comprises a plurality of storage spaces. When the reticle is put in a storage space, the cabinet identifies the reticle and the storage space occupied thereby. The cabinet provides inert gas to the reticle.

An embodiment of a reticle management system comprises at least one reticle and at least one cabinet with an inert gas environment, and a computer system to present the information in the cabinet. The cabinet comprises a plurality of storage spaces. When the reticle is put in one of the storage spaces, the cabinet detects an identification of the reticle, and an identification of the storage space with the reticle. The information of reticle will be sent to the MES and dispatching system for operation. The cabinet charges inert gas to the reticle.

In an embodiment of a reticle management method, at least one reticle is put in one of storage spaces of at least one cabinet with an inert gas environment. An identification of the reticle is detected. An identification of the storage space with the reticle is detected. The reticle is charged with inert gas.

Reticle management systems and methods may take the form of program code embodied in a tangible media. When the program code is loaded into and executed by a machine, the machine becomes an apparatus for practicing the disclosed method.

BRIEF DESCRIPTION OF THE DRAWINGS

The invention will become more fully understood by referring to the following detailed description with reference to the accompanying drawings, wherein.

DETAILED DESCRIPTION OF THE INVENTION

Reticle management systems and methods are provided.

Figure 2:
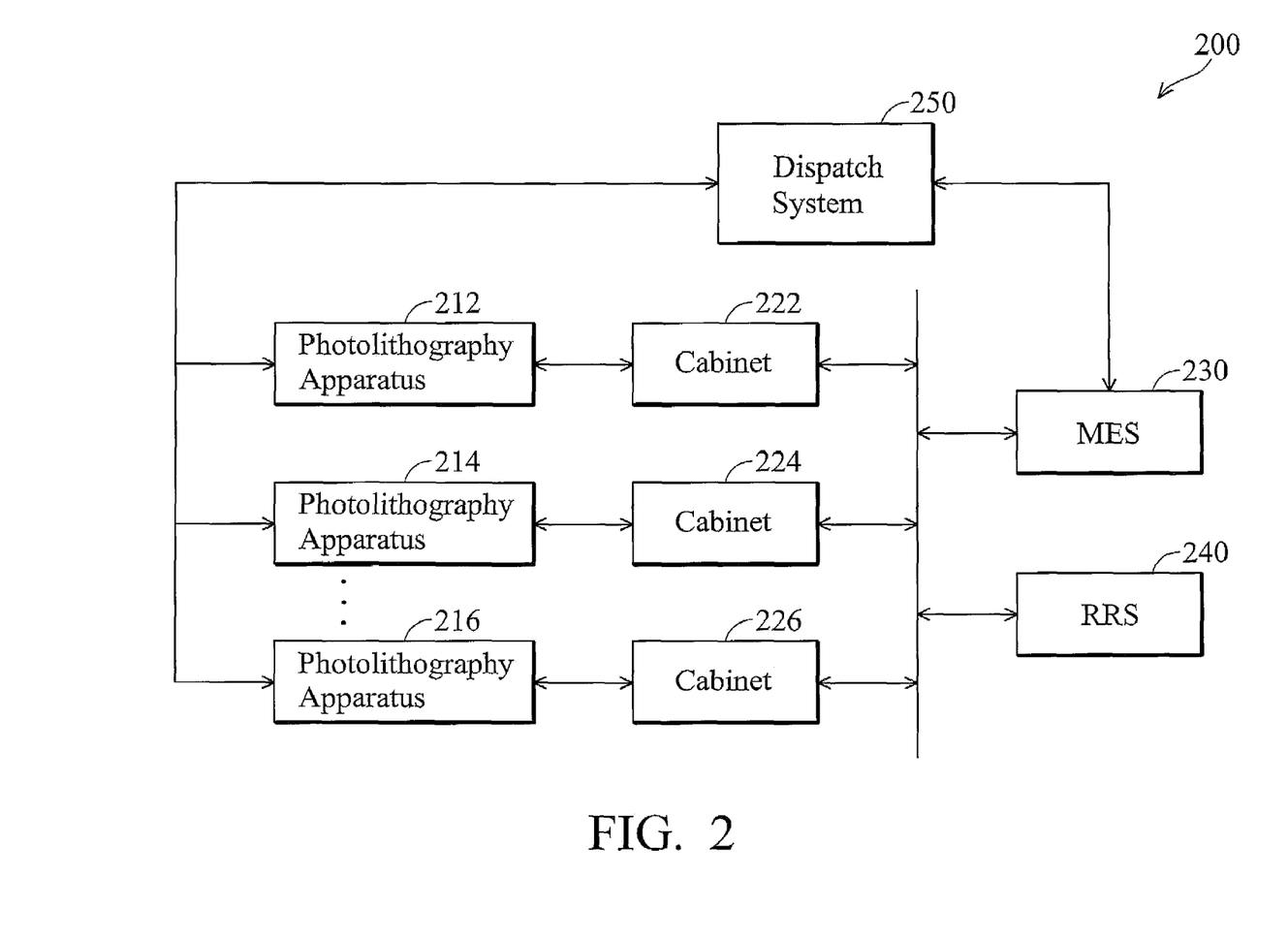
FIG. 2 is a schematic diagram illustrating an embodiment of a reticle management system.

FIG. 2 illustrates an embodiment of a reticle management system.

The reticle management system 200 comprises a plurality of photolithography apparatuses 212, 214 and 216, and a plurality of cabinets 222, 224 and 226. In this embodiment, photolithography apparatuses 212, 214 and 216 respectively use cabinets 222, 224 and 226 for reticle storage. Cabinets 222, 224 and 226 are respectively located adjacent to photolithography apparatuses 212, 214 and 216. It is understood that, in some embodiments, several photolithography apparatuses may commonly use one cabinet. For example, photolithography apparatuses 212 and 214 may commonly use cabinet 222.

Figure 3:
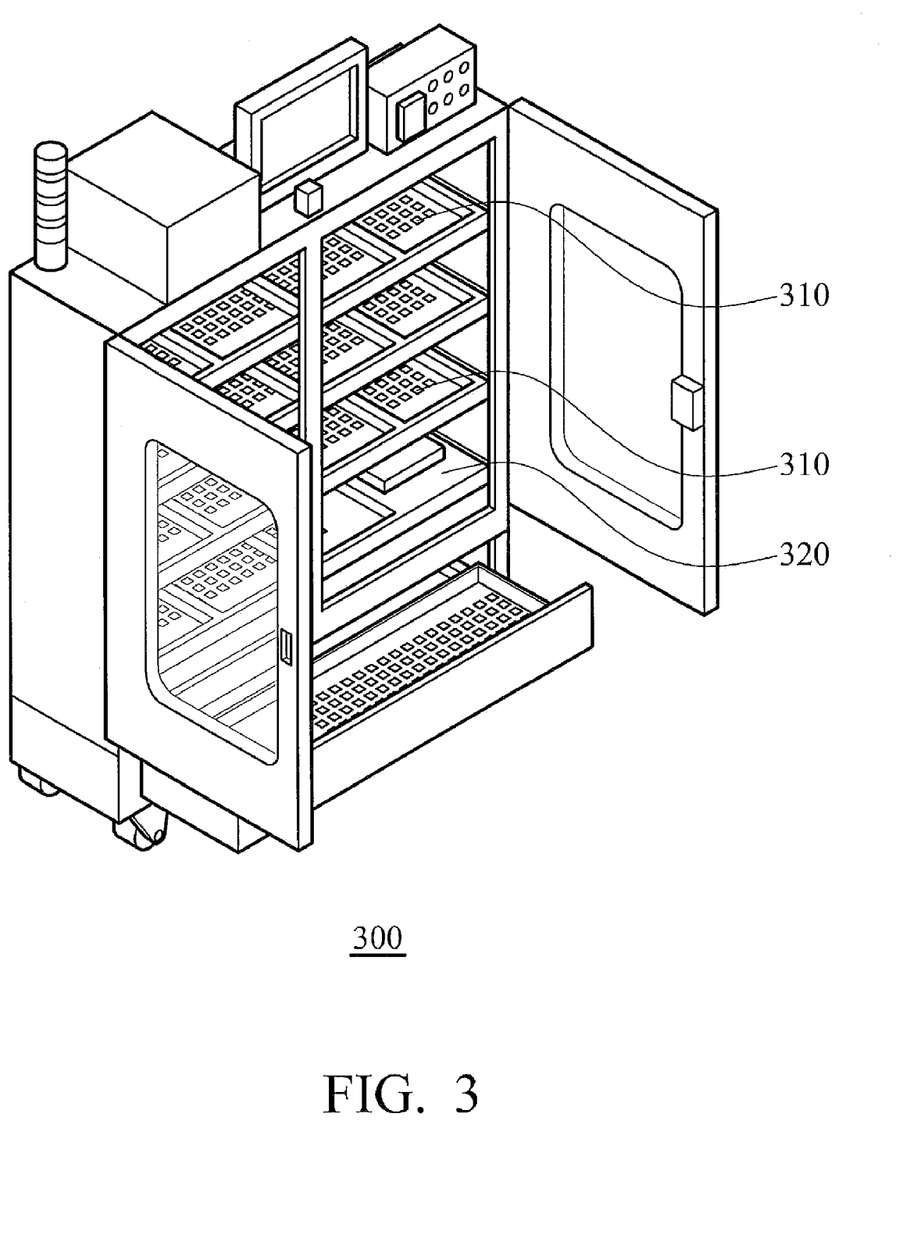
FIG. 3 is a schematic diagram illustrating an embodiment of a cabinet.

FIG. 3 illustrates an embodiment of a cabinet. The cabinet 300 provides an environment of inert gas such as nitrogen. The cabinet 300 comprises a plurality of storage spaces 310 and a specific space 320. Racks of retiles can be put in the storage spaces. In some embodiments, each rack (or reticle) has a RF sensor and bar code. If a rack is put into the cabinet, an identification of the reticle is detected by reading RFID or scanning the bar code thus to identify the reticle. Each storage space has a rack identification, and has a sensor (not shown) detecting the presence of a rack therein. If a rack is put in a storage space, the identification of the storage space is transmitted to a controller (not shown) of the cabinet. Storage information comprising which rack (reticle) is placed in which storage space is provided according to the identifications of racks (reticles) and storage spaces. Additionally, a rack can be placed in the specific space 320 for charging by inert gas. An inert gas status of the rack (reticle) can be monitored. The inert gas status comprises the time of charging. The inert gas status allows determination of whether a reticle has been fully charged with inert gas.

The cabinets 222, 224 and 226 are coupled to a MES (Manufacturing Execution System) 230 and a RRS (Reticle Report System) 240. Storage information of respective cabinets is transmitted to the RRS 240. Dispatch information comprising storage information of respective cabinets and the inert gas status of respective racks (reticles) in cabinets is transmitted to the MES 230. It is understood that each cabinet is identifiable based on its identification. The MES 230 and RRS 240 can recognize the received information according to identification of the cabinets. The MES 230 and RRS 240 may be query systems comprising interfaces for locating racks (reticles) according to identification of racks (reticles) and/or storage spaces and cabinets.

The MES 230 can transmit the dispatch information to a dispatch system 250. The dispatch system 250 determines whether a reticle is ready according to the dispatch information. For example, if the inert gas status of a specific reticle indicates the specific reticle has been fully charged, the specific reticle is considered ready, at which point at least one lot such as wafers corresponding to the specific reticle is located, where the lot requires the reticle to be processed in photolithography. The dispatch system 250 drives an OHT (Overhead Transport) system to dispatch the lot to the photolithography apparatus corresponding to the cabinet storing the specific reticle.

The photolithography apparatuses 212, 214 and 216 may be scanners comprising monitors displaying related information. The photolithography apparatuses 212, 214 and 216 couple to the dispatch system 250. If a lot is dispatched to a photolithography apparatus, the monitor of the photolithography apparatus displays the identification of the rack (reticle) corresponding to the lot, and the location of the rack (reticle) (the identification of the cabinet and the identification of the storage space with the reticle in the cabinet). The reticle can be obtained from the cabinet, and moved to the photolithography apparatus. The photolithography apparatus processes the lot with the reticle. The reticle is moved from the photolithography apparatus to the cabinet for storage and/or charging if the lot has been processed.

Figure 4:
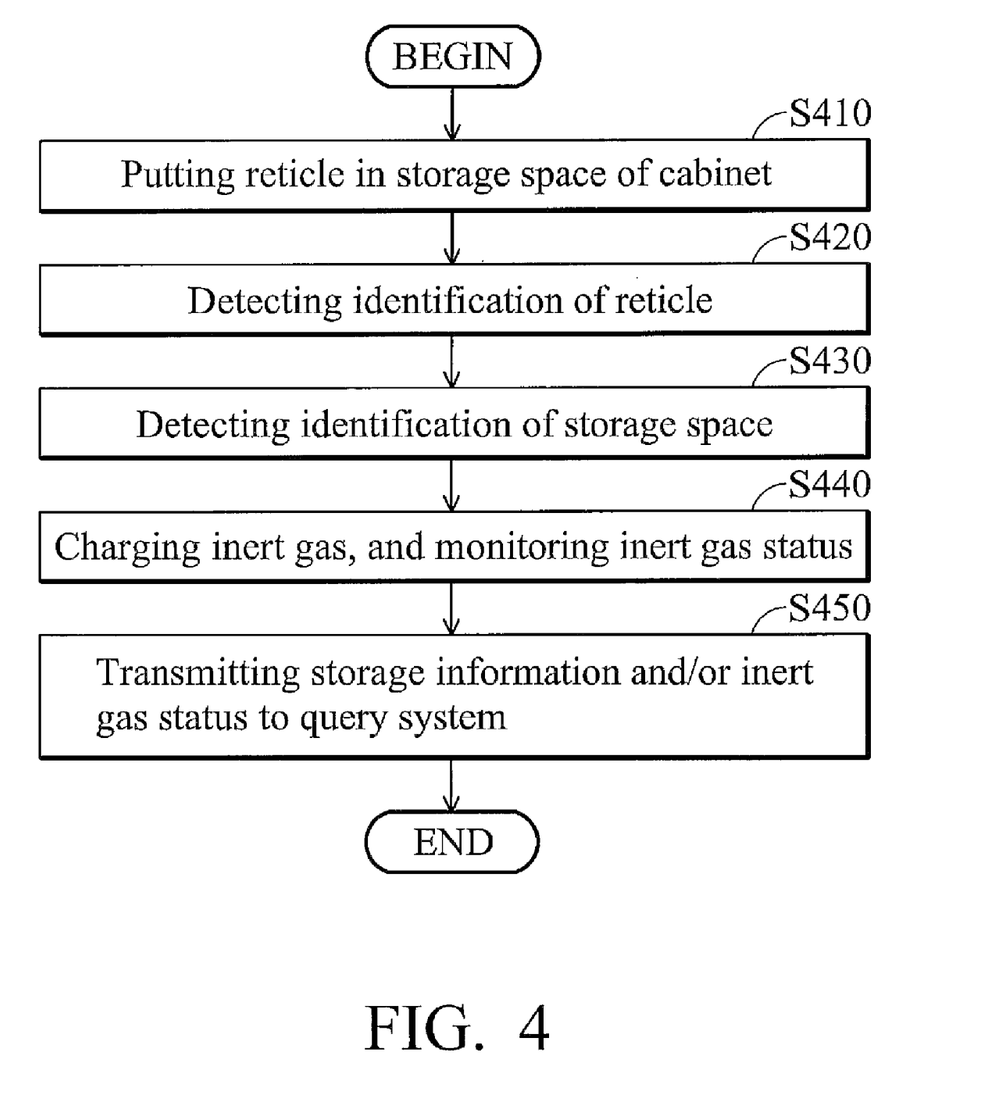
FIG. 4 is a flowchart of an embodiment of a reticle management method.

FIG. 4 shows an embodiment of a reticle management method. In step S410, a reticle (rack) is put in a storage space of a cabinet with an inert gas environment. In step S420, the reticle is identified, where identification of the reticle is detected, in some embodiments by reading a RFID sensor of the reticle (rack). In step S430, the storage space housing the reticle is identified, where position ID of the storage space will be detected by a sensor that is corresponding to the storage space. In step S440, the reticle (rack) is charged with inert gas, with inert gas status of the reticle monitored. In step S450, the identification of the cabinet, the storage information comprising identification of reticles and the corresponding identifications of storage spaces and/or the inert gas status of the reticle in the cabinet are transmitted to at least one query system such as MES 230 and/or RRS 240.

Figure 5:
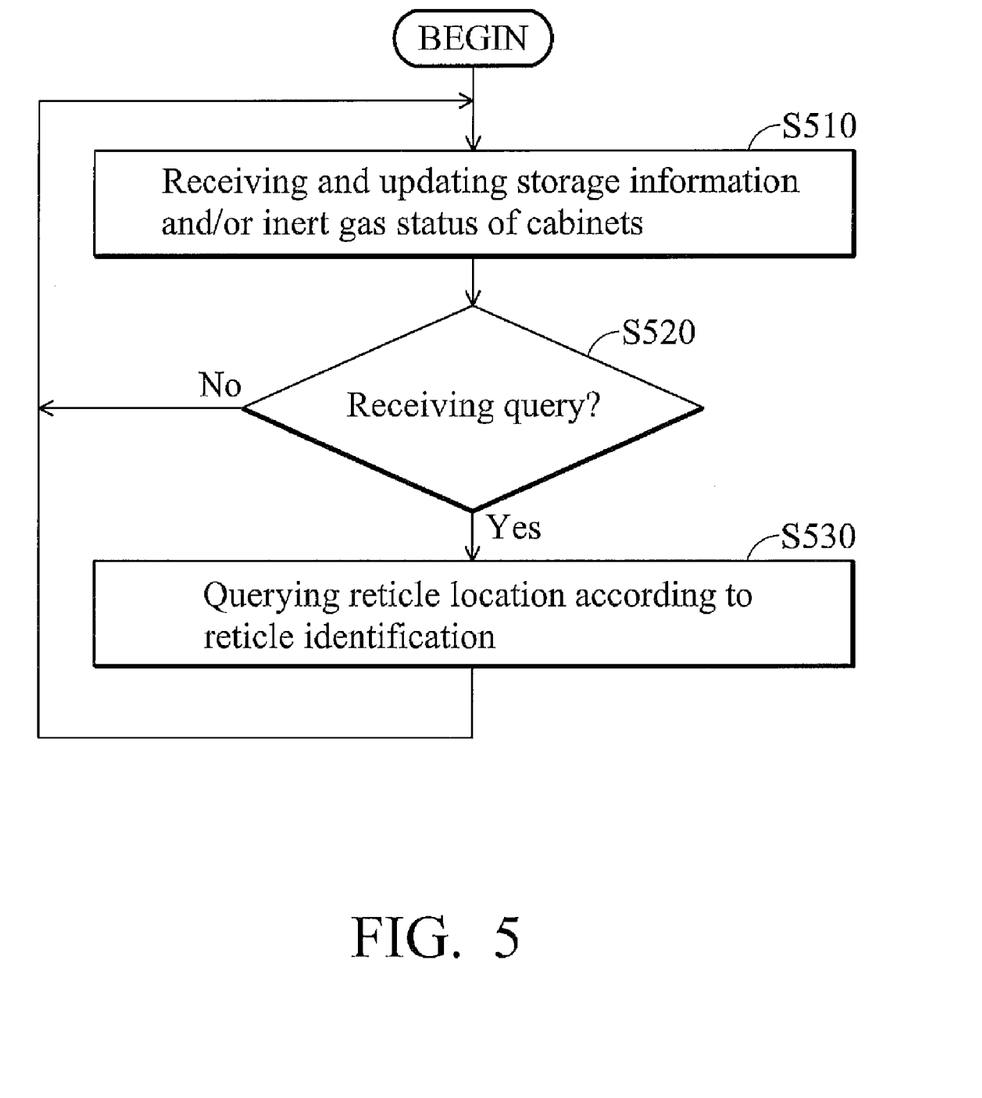
FIG. 5 is a flowchart of an embodiment of a reticle management method.

FIG. 5 shows an embodiment of a reticle management method. In step S510, the query system receives and updates the storage information and/or inert gas status of reticles from cabinets based on identification of cabinets. In step S520, it is determined whether a query for a reticle location has been received. If not, step S510 is repeated. If so, in step S530, the reticle location is queried according to the identification of the reticle and the received storage information.

Figure 6:
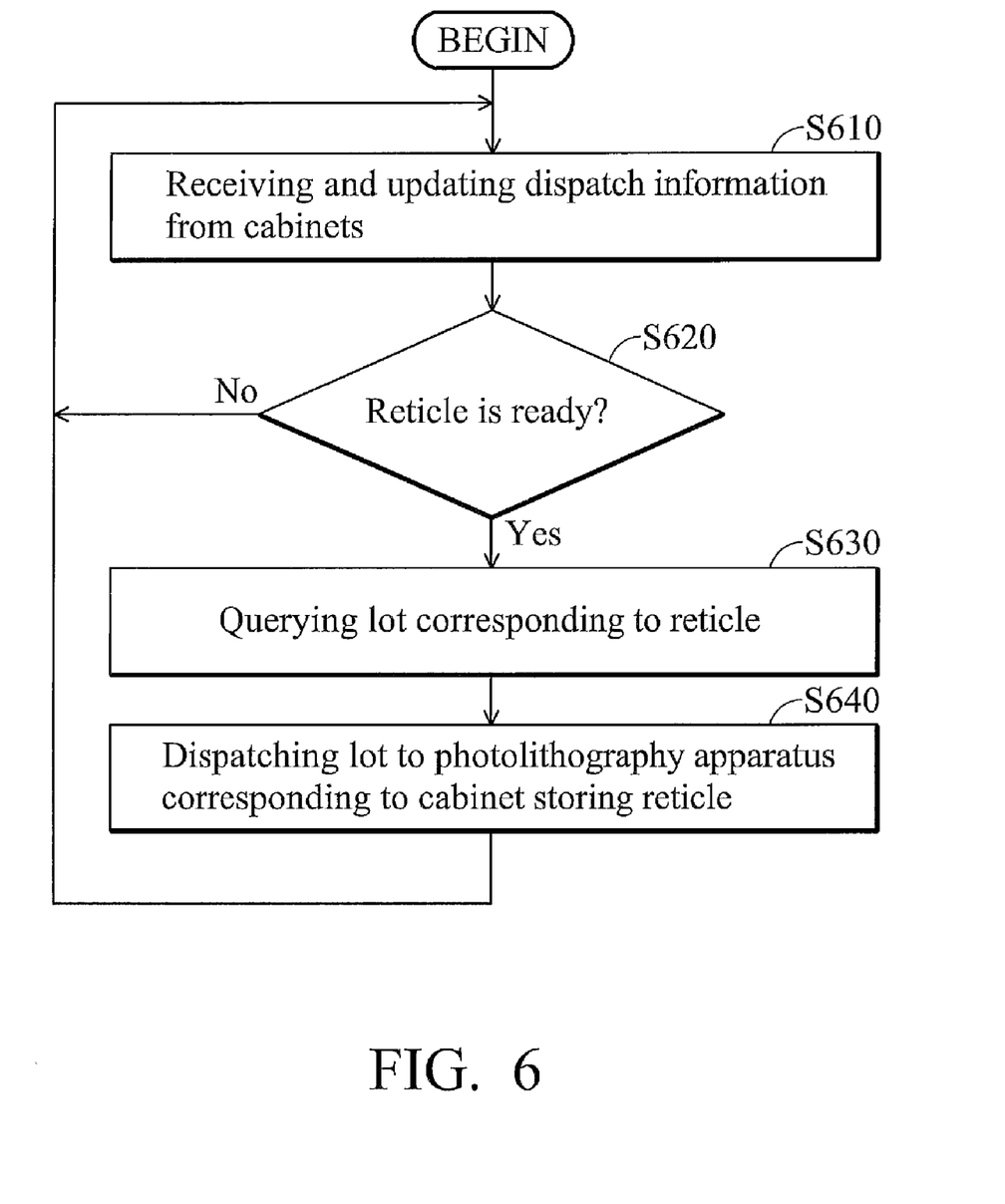
FIG. 6 is a flowchart of an embodiment of a reticle management method.

FIG. 6 shows an embodiment of a reticle management method. In step S610, the dispatch system receives and updates dispatch information comprising storage information and inert gas statuses of reticles of cabinets. In step S620, it is determined whether any reticle in the cabinet is ready. In some embodiments, if the inert gas status of the reticle indicates the reticle has been fully charged with the inert gas, the reticle is considered ready. If not, step S610 is repeated. If so, in step S630, at least one lot corresponding to the reticle is queried, and in step S640, the lot is dispatched to a photolithography apparatus corresponding to the cabinet storing the reticle.

Figure 7:
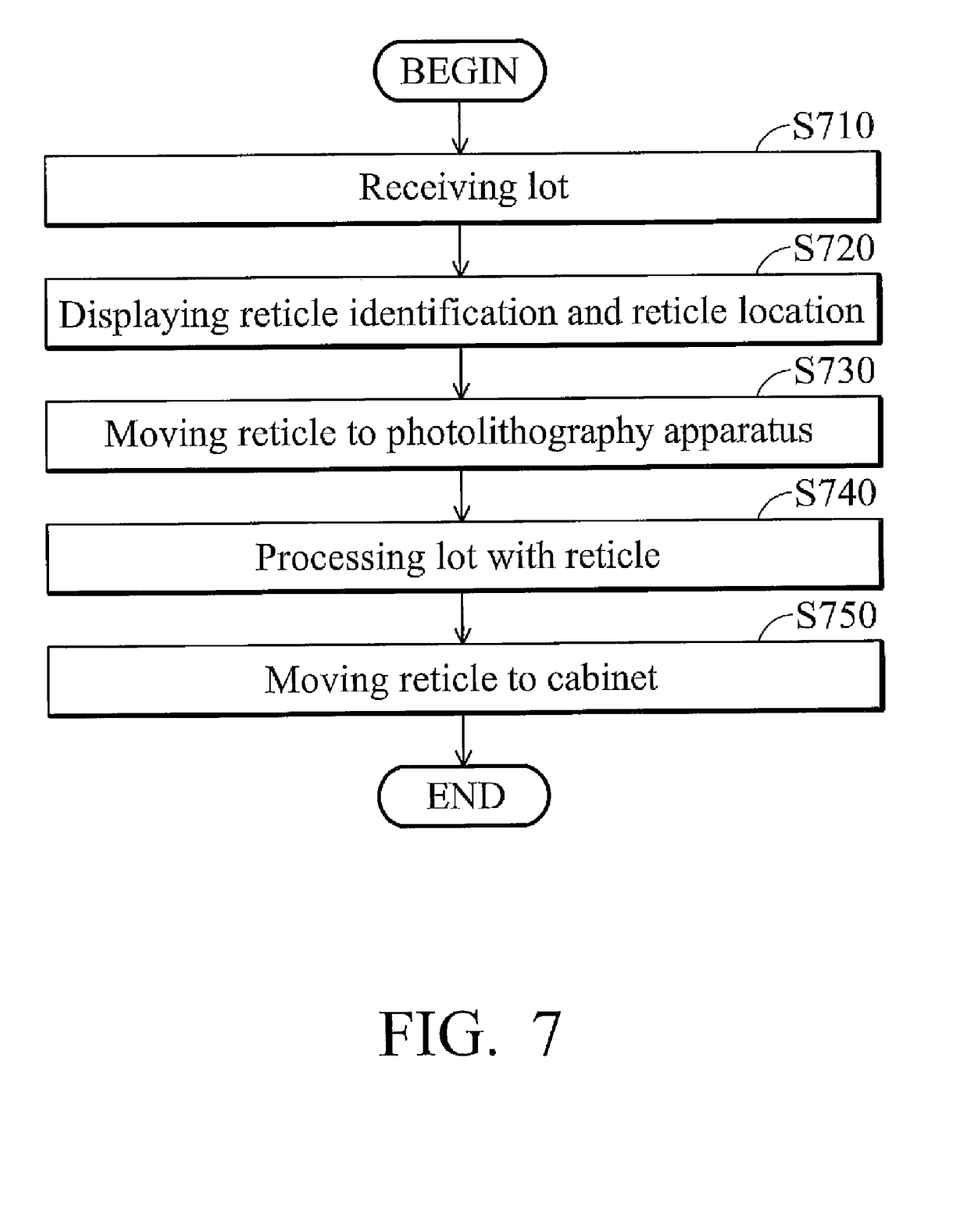
FIG. 7 is a flowchart of an embodiment of a reticle management method.

FIG. 7 shows an embodiment of a reticle management method. In step S710, a photolithography apparatus receives at least one lot. In step S720, the identification of a reticle corresponding to the lot and the reticle location are displayed. The reticle location comprises the identification of a specific cabinet, and the identification of a specific storage space in the specific cabinet. In some embodiments, the identification of the reticle may not be displayed. In step S730, the reticle is located and moved from the specific cabinet to the photolithography apparatus. It is understood that the order of steps S710, S720 and S730 is not fixed. For example, the reticle identification and reticle location may first be displayed, the reticle then moved to the photolithography apparatus, and the lot finally dispatched to the photolithography apparatus. In some embodiments, the reticle identification and reticle location are first displayed, the lot is dispatched to the photolithography apparatus, and the reticle is then moved to the photolithography apparatus. In step S740, the lot is processed with the reticle on the photolithography apparatus. After the lot is processed, in step S750, the reticle is moved from the photolithography apparatus to the specific cabinet for storage and/or charging.

Reticle management systems and methods, or certain aspects or portions thereof, may take the form of program code (i.e., executable instructions) embodied in tangible media, such as products, floppy diskettes, CD-ROMS, hard drives, or any other machine-readable storage medium, wherein, when the program code is loaded into and executed by a machine, such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the disclosed methods. When implemented on a general-purpose processor, the program code combines with the processor to provide a unique apparatus that operates analogously to application specific logic circuits.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A reticle management system, comprising:
   at least one reticle;
   at least one cabinet with an inert gas environment, comprising a plurality of storage spaces, wherein when the reticle is put in one of the storage spaces, the cabinet detects an identification of the reticle, detects an identification of the storage space with the reticle, and charges inert gas to the reticle;

at least one photolithography apparatus; and a dispatch system coupled to the cabinet, receiving an inert gas status of the reticle, querying at least one lot corresponding to the reticle if the inert gas status indicates the reticle has been fully charged with the inert gas, and dispatching the lot to the photolithography apparatus for processing.

2. The system of claim 1 further comprising a query system coupled to the at least one cabinet, receiving the identification of the reticle and the identification of the storage space with the reticle, and providing an interface for querying a location of the reticle according to the identification of the reticle.

3. The system of claim 2 wherein the query system comprises a manufacturing execution system or a reticle report system.

4. The system of claim 1 wherein the reticle comprises a bar code or RFID, and the cabinet detects the identification of the reticle by scanning the bar code or reading RFID.

5. The system of claim 1 wherein the cabinet charges the inert gas to a rack containing the reticle.

6. The system of claim 1 wherein the cabinet further monitors an inert gas status of the reticle.

7. The system of claim 1 wherein the photolithography apparatus further comprises a monitor displaying the identification of the reticle and the identification of the storage space with the reticle in the cabinet.

8. The system of claim 7 wherein the reticle is moved from the cabinet to the photolithography apparatus, and processed with the lot.

9. The system of claim 8 wherein the reticle is moved from the photolithography apparatus to the cabinet for storage if the lot has been processed.

10. The system of claim 1 wherein the inert gas comprises nitrogen.

11. The system of claim 1 wherein the photolithography apparatus comprises a scanner.

12. A reticle management method, comprising:
putting at least one reticle in one of storage spaces of at least one cabinet with an inert gas environment;
detecting identification of the reticle;
detecting identification of the storage space with the reticle;
charging inert gas to the reticle;
querying at least one lot corresponding to the reticle if an inert gas status of the reticle indicating the reticle has been fully charged with the inert gas; and
dispatching the lot to at least one photolithography apparatus for processing.

13. The method of claim 12 further comprising:
reception of the identification of the reticle, and the identification of the storage space with the reticle by a query system; and
provision an interface for querying a location of the reticle according to the identification of the reticle by the query system.

14. The method of claim 12 further comprising detecting the identification of the reticle by scanning a bar code or reading RFID of the reticle.

15. The method of claim 12 further comprising charging the inert gas to a rack containing the reticle.

16. The method of claim 12 further comprising monitoring an inert gas status of the reticle in the cabinet.

17. The method of claim 12 further comprising display of the identification of the reticle and the identification of the storage space with the reticle in the cabinet by the photolithography apparatus.

18. The method of claim 17 further comprising:
moving the reticle from the cabinet to the photolithography apparatus; and
processing the lot with the reticle.

19. The method of claim 18 further comprising moving the reticle from the photolithography apparatus to the cabinet for storage if the lot has been processed.

20. The method of claim 12 wherein the inert gas comprises nitrogen.

21. A reticle management system, comprising:
at least one reticle;
at least one cabinet with an inert gas environment, comprising a plurality of storage spaces, wherein when the reticle is put in a storage space, the cabinet identifies the reticle, identifies the storage space occupied thereby, and provides inert gas to the reticle;
at least one photolithography apparatus; and
a dispatch system coupled to the cabinet, receiving an inert gas status of the reticle, querying at least one lot corresponding to the reticle if the inert gas status indicates the reticle has been fully charged with the inert gas, and dispatching the lot to the photolithography apparatus for processing.

22. The system of claim 21 further comprising a query system coupled to the at least one cabinet, receiving identification of the reticle and identification of the storage space with the reticle, and providing an interface for querying a location of the reticle according to the identification of the reticle.

23. The system of claim 21 wherein the photolithography apparatus further comprises a monitor displaying the identification of the reticle and the identification of the storage space with the reticle in the cabinet.

24. The system of claim 23 wherein the reticle is moved from the cabinet to the photolithography apparatus, processed with the lot, and moved from the photolithography apparatus to the cabinet for storage if the lot has been processed.

* * * * *